United States Patent
Kimoto et al.

(10) Patent No.: US 9,569,568 B2
(45) Date of Patent: Feb. 14, 2017

(54) ROBOT SIMULATION SYSTEM WHICH SIMULATES TAKEOUT PROCESS OF WORKPIECE

(71) Applicant: FANUC Corporation, Yamanashi (JP)

(72) Inventors: Yuuki Kimoto, Yamanashi (JP); Yoshiharu Nagatsuka, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 45 days.

(21) Appl. No.: 14/642,014

(22) Filed: Mar. 9, 2015

(65) Prior Publication Data
US 2015/0254380 A1    Sep. 10, 2015

(30) Foreign Application Priority Data

Mar. 10, 2014    (JP) .................. 2014-046444

(51) Int. Cl.
*G06G 7/48* (2006.01)
*G06F 17/50* (2006.01)

(52) U.S. Cl.
CPC . *G06F 17/5009* (2013.01); *G05B 2219/40323* (2013.01)

(58) Field of Classification Search
CPC ............................... G05B 2219/40323
USPC ............................................. 703/6
See application file for complete search history.

(56) References Cited

U.S. PATENT DOCUMENTS

| | | | |
|---|---|---|---|
| 6,597,971 B2 * | 7/2003 | Kanno ................ | B25J 9/1666 318/568.13 |
| 6,845,296 B2 * | 1/2005 | Ban .................... | B25J 9/1697 345/103 |
| 7,474,939 B2 * | 1/2009 | Oda .................... | B25J 9/1697 382/153 |
| 7,657,346 B2 * | 2/2010 | Ban .................... | B25J 9/1697 318/568.16 |
| 7,881,917 B2 * | 2/2011 | Nagatsuka .......... | B25J 9/1671 703/6 |
| 2003/0090489 A1 | 5/2003 | Watanabe et al. | |
| 2005/0071048 A1 | 3/2005 | Watanabe et al. | |
| 2005/0096892 A1 | 5/2005 | Watanabe et al. | |
| 2012/0029686 A1 * | 2/2012 | Ban .................... | B25J 9/1679 700/218 |
| 2013/0114861 A1 | 5/2013 | Takizawa | |

(Continued)

FOREIGN PATENT DOCUMENTS

| | | | |
|---|---|---|---|
| DE | 102012021375 A1 | 5/2013 | |
| DE | 102013012068 A1 | 1/2014 | |

(Continued)

*Primary Examiner* — Hugh Jones
(74) *Attorney, Agent, or Firm* — Hauptman Ham, LLP

(57) ABSTRACT

A robot simulation system includes a model placement part which places a three-dimensional container model in a virtual space and places three-dimensional workpiece models which have any postures at initial positions above the container model and a drop operation simulation part which simulates a drop operation in which the workpieces drop from the initial positions to the inside of the container by action of gravity. The robot simulation system is configured to create a bulk stacked state of workpiece models, based on the positions and postures of the workpiece models which are obtained as a result of simulation of the drop operation.

5 Claims, 12 Drawing Sheets

(56) References Cited

U.S. PATENT DOCUMENTS

2014/0031985 A1* 1/2014 Kumiya ................ B25J 9/1697
                                                            700/259

FOREIGN PATENT DOCUMENTS

| JP | 2007-241857 A | 9/2007 |
| JP | 2007-326160 A | 12/2007 |
| JP | 2012-223845 A | 11/2012 |
| JP | 2015-100866 A | 6/2015 |

* cited by examiner

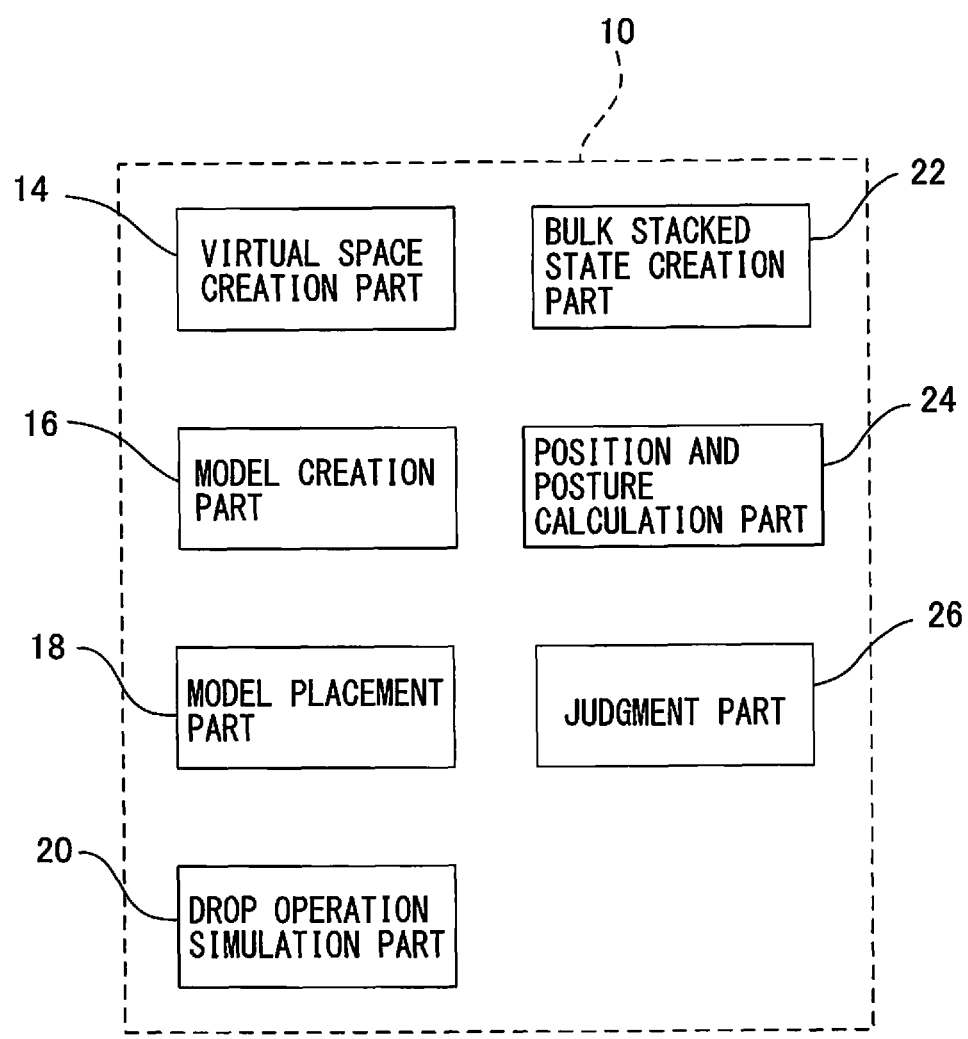

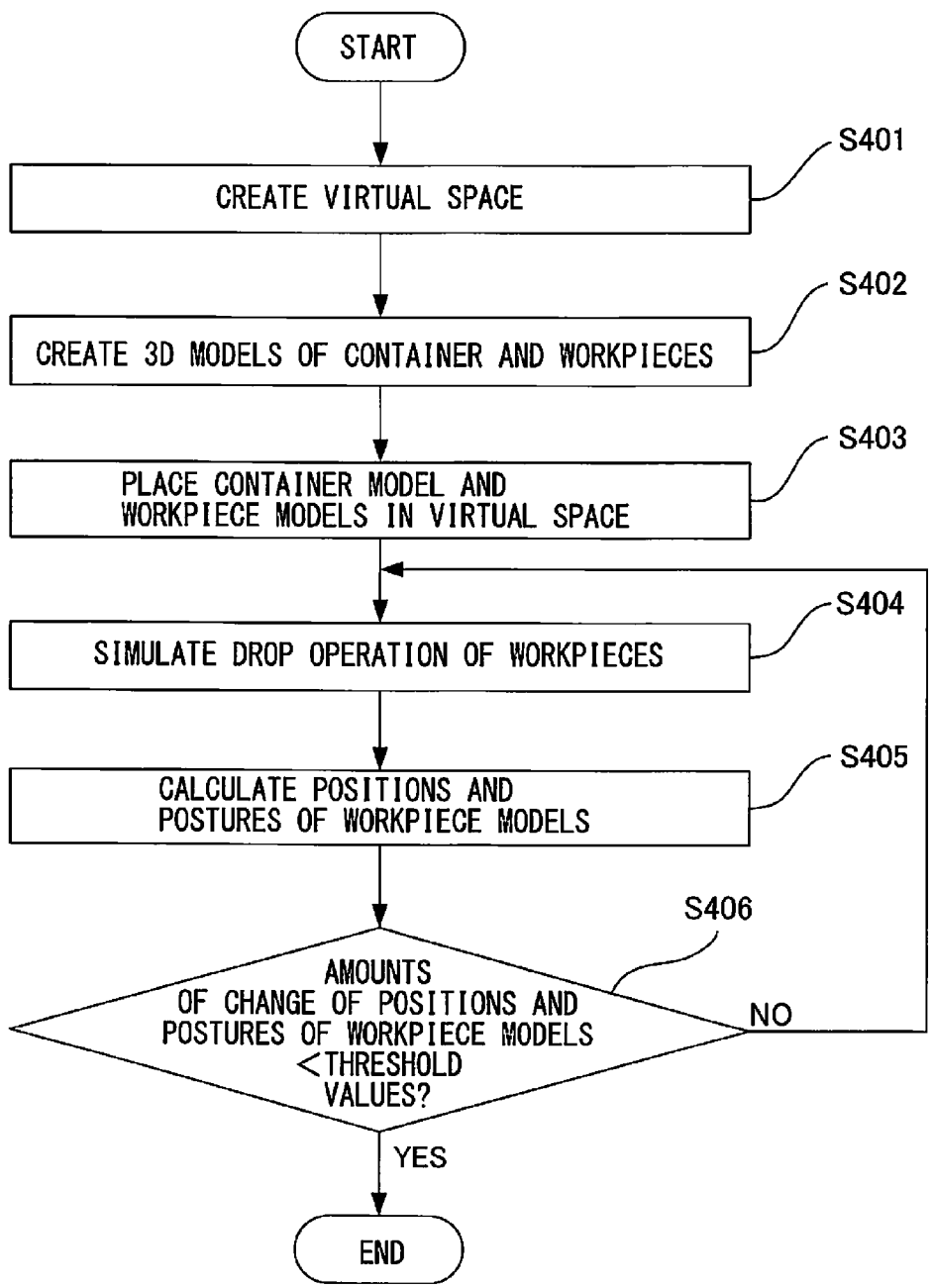

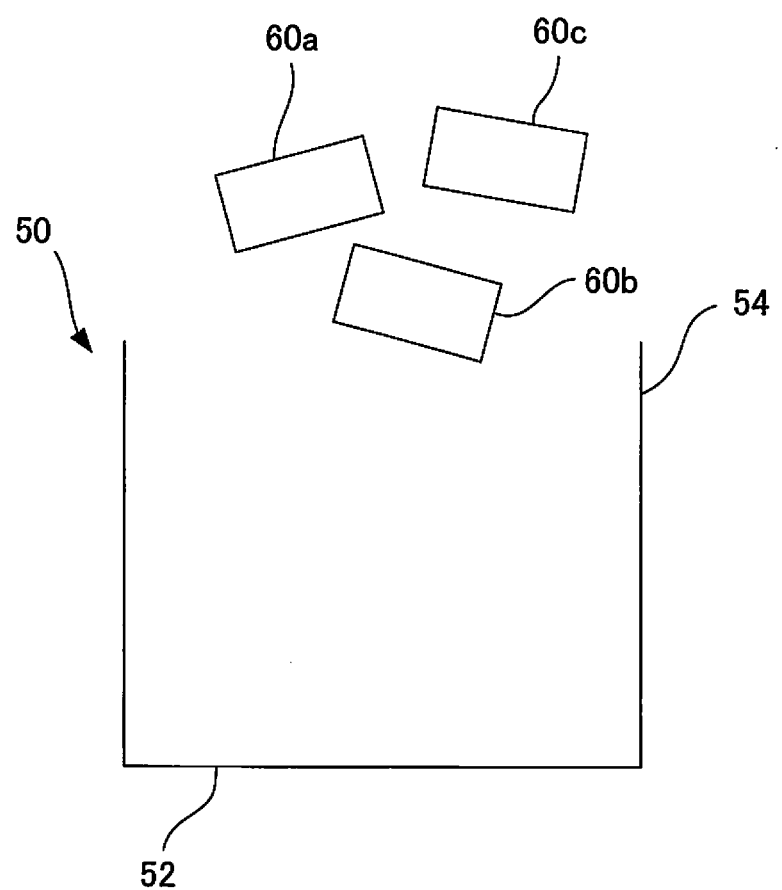

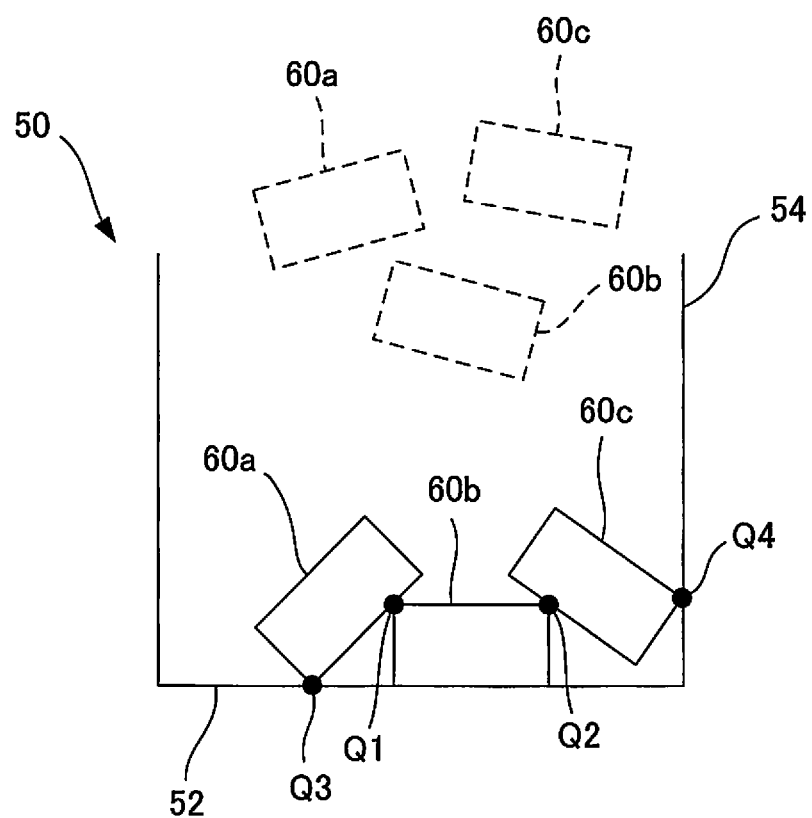

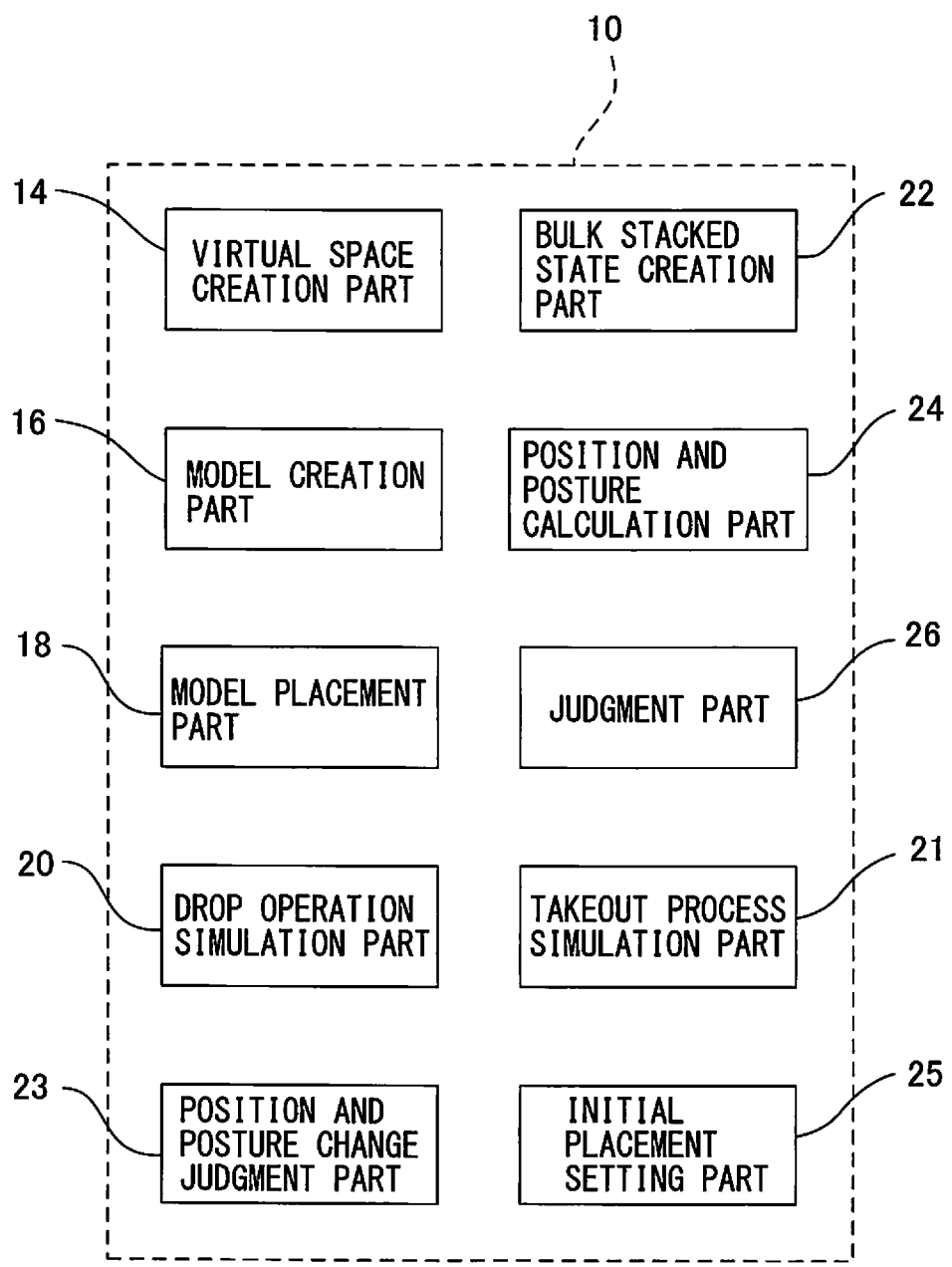

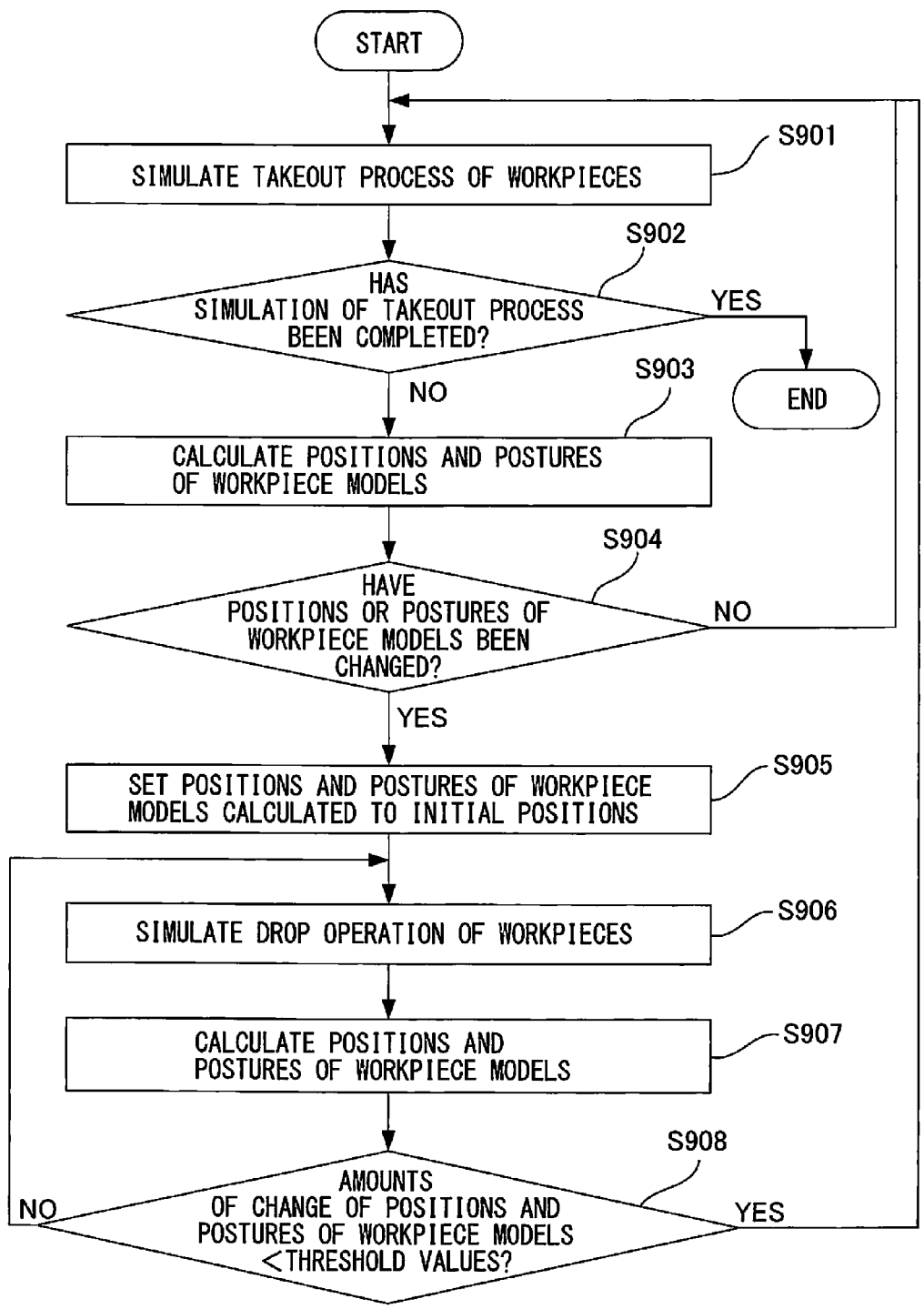

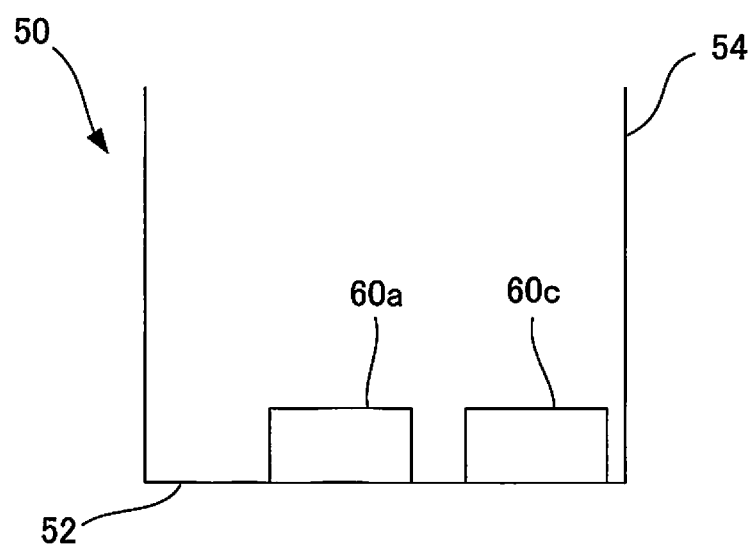

ROBOT SIMULATION SYSTEM WHICH SIMULATES TAKEOUT PROCESS OF WORKPIECE

RELATED APPLICATIONS

The present application claims priority to Japanese Application Number 2014-046444, filed Mar. 10, 2014, the disclosure of which is hereby incorporated by reference herein in its entirety.

BACKGROUND OF THE INVENTION

1. Field of the Invention

The present invention relates to a robot simulation system which simulates a takeout process of workpieces.

2. Description of the Related Art

A robot simulation system is used for simulating a robot handling a workpiece or performing another predetermined operation in a virtual space. The results of simulation are utilized for evaluating a control program of the robot and for making corrections in accordance with need.

JP2007-326160A discloses a robot simulation system which is used for predicting interference between a robot and a workpiece and interference between a robot and a container when taking out a plurality of workpieces which are bulk stacked inside the container.

For example, when simulating the operation of a robot when workpieces which are bulk stacked in a container are successively taken out by the robot, it is necessary to create workpieces in a bulk stacked state in a virtual space. In the robot simulation system which is disclosed in JP2007-326160A, the positions and postures of the workpiece models are randomly determined. However, when randomly placing workpiece models, the effects of gravity etc. are not considered, so an unnatural bulk stacked state which did not sufficiently reflect the bulk stacked state which could actually occur was created.

Therefore, there is a need for a robot simulation system which is able to create workpieces in a bulk stacked state while considering the gravity which acts on the workpieces and interference with the workpieces.

SUMMARY OF THE INVENTION

According to a first aspect of the present invention, there is provided a robot simulation system which simulates a takeout process for successively taking out a plurality of workpieces which are bulk stacked in a container in a work space by a robot, the robot simulation system comprising: a virtual space creation part which creates a virtual space which expresses the work space three-dimensionally; a model creation part which creates a container model which expresses the container three-dimensionally and a plurality of the workpiece models which express the plurality of the workpieces three-dimensionally; a model placement part which places the container model in the virtual space and which places the workpiece models which have any postures at initial positions above the container model; a drop operation simulation part which simulates a drop operation in which the workpieces drop from the initial positions to the inside of the container by action of gravity; and a bulk stacked state creation part which creates a bulk stacked state of the workpiece models, based on the positions and postures of the workpiece models which are obtained as a result of simulation of the drop operation.

According to a second aspect of the present invention, there is provided the robot simulation system according to the first aspect wherein the drop operation simulation part is configured to simulate the drop operation by taking into account the gravity which acts on the workpiece models, interference between the workpiece models, and interference between the workpiece models and the container model.

According to a third aspect of the present invention, there is provided the robot simulation system according to the second aspect wherein the drop operation simulation part is configured to simulate the drop operation by additionally taking into account an impact force and frictional force which act on the workpiece models.

According to a fourth aspect of the present invention, there is provided the robot simulation system according to any one of the first to third aspects wherein the model placement part is configured to place the workpiece models at initial positions such that the workpiece models do not interfere with each other and that the workpiece models drop into the container model.

According to a fifth aspect of the present invention, there is provided the robot simulation system according to any one of the first to fourth aspects, further comprising: a position and posture calculation part which calculate positions and postures of the workpiece models during the simulation of the drop operation and a judgment part which judges whether the simulation of the drop operation has finished, wherein the judgment part is configured such that when amounts of change of positions and postures of the workpiece models which are calculated by the position and posture calculation part are smaller than predetermined threshold values, it judges that the simulation of the drop operation has finished.

According to a sixth aspect of the present invention, there is provided the robot simulation system according to the fifth aspect wherein the position and posture calculation part is configured to further calculate positions and postures of the workpiece models during the simulation of the takeout operation, the drop operation simulation part is configured to further simulate the drop operation of the workpieces, based on the positions and postures of the workpiece models which are obtained by the position and posture calculation part during the simulation of the takeout process, and the bulk stacked state creation part is configured to further create a bulk stacked state of the workpieces, based on the positions and postures of the workpiece models which are obtained as a result of simulation of the drop operation during the simulation of the takeout process.

These and other objects, features, and advantages of the present invention will become clearer with reference to the detailed description of illustrative embodiments of the present invention which are shown in the attached drawings.

BRIEF DESCRIPTION OF THE DRAWINGS

FIG. 3 is a functional block diagram of the robot simulation system.

FIG. 4 is a flow chart which shows the flow of processes for creating workpiece models in a bulk stacked state.

FIG. 6A is a view which shows workpiece models at initial positions.

FIG. 6B is a view which shows workpiece models which have dropped from their initial positions.

FIG. 8 is a functional block diagram of a robot simulation system.

FIG. 9 is a flow chart which shows the flow of the processes for creating workpiece models in a bulk stacked state during simulation of a takeout process.

FIG. 10C is a view which shows workpiece models after simulation of a drop operation.

DETAILED DESCRIPTION OF THE INVENTION

Figure 1:
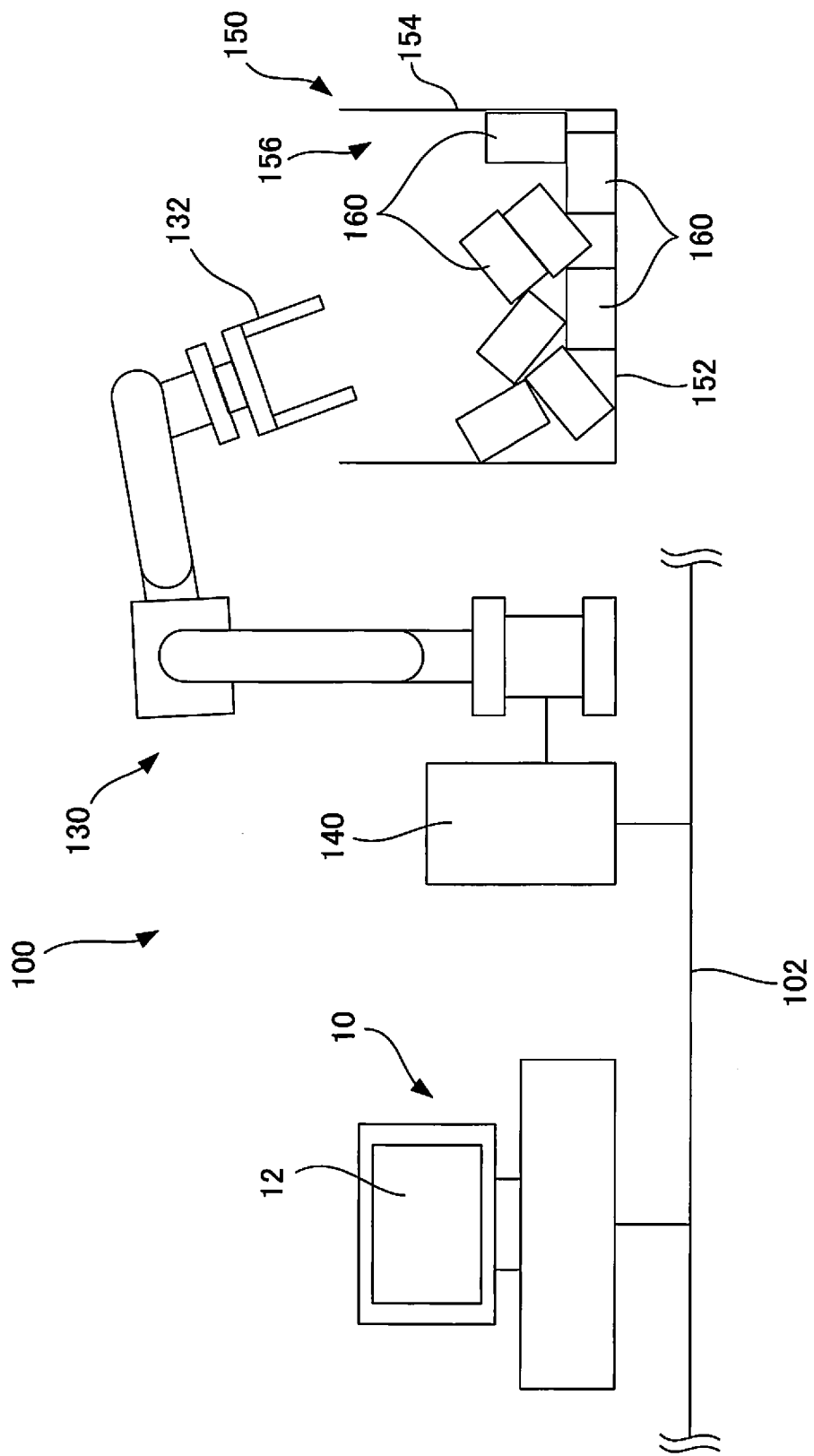
FIG. 1 is an overall view of the layout of a robot system which includes a robot simulation system according to the present embodiment.

Below, the present invention will be described while referring to the accompanying drawings. The constituent elements of the illustrated embodiments are suitably changed in scale to facilitate understanding of the present invention. Further, the same or corresponding constituent elements are assigned the same reference numerals throughout the drawings.

FIG. 1 is an overall view of the layout of a robot system 100 which includes a robot simulation system 10 according to the present embodiment. The robot simulation system 10 is, for example, a digital computer which is configured to create and run a robot program. The robot system 100 is further provided with a robot 130. The robot 130 is a multiple joints robot which is controlled by a robot control device 140. The robot simulation system 10 and the robot control device 140 are connected with each other through a communicating means 102 which has a known configuration. The communicating means 102 is, for example, used for transmitting a control program which is created by the robot simulation system 10 to the robot control device 140.

The robot 130 is, for example, provided with a hand 132 which can grip a workpiece 160 at a tip end of its arm. The robot 130 is controlled by the robot control device 140 so as to successively take out workpieces 160 from the large number of workpieces 160 which are bulk stacked, that is, are irregularly arranged, inside a container 150.

The container 150 has the form of a basket which has, for example, a bottom 152 and a peripheral wall 154 which extends upward from the bottom 152 substantially in a vertical direction. The container 150 is opened toward the top. The robot 130 is designed to be able to access an accommodation space 156 which is defined by the bottom 152 and peripheral wall 154 of the container 150 from the top.

In the illustrated example, each workpiece 160 has a rectangular parallelepiped shape, but the workpiece 160 is not limited in shape to this. Rather, the container 150 may have any shape so long as the robot 130 can access the inside of the accommodation space 156.

The robot simulation system 10, although not shown, is provided with a CPU for performing various calculations, a RAM which stores the results of calculations by the CPU, a ROM which stores various programs, and an input device. The input device may be a mouse, keyboard, or other known input means. The robot simulation system 10 is further provided with a liquid crystal display or other display part 12.

Figure 2:
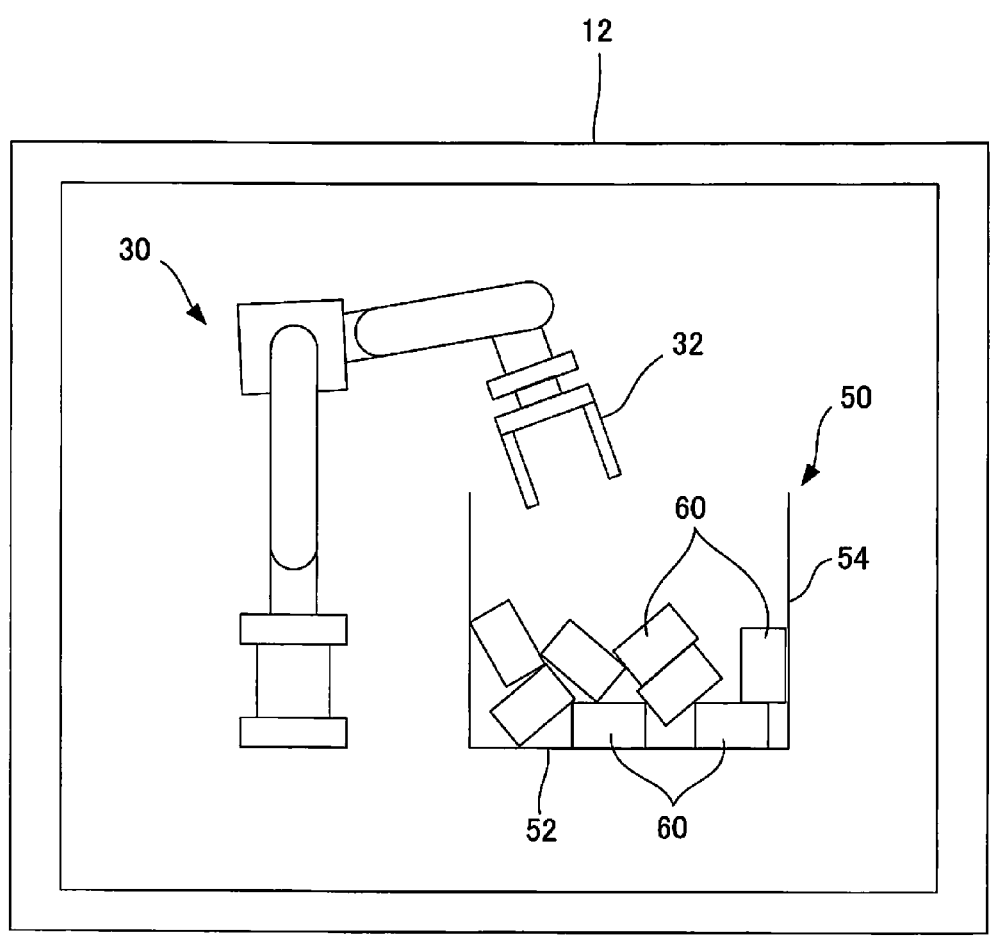
FIG. 2 is an example of the display by a display part of the robot simulation system.

FIG. 2 shows an example of the display by a display part 12 of the robot simulation system 10. The display part 12 displays a virtual space which expresses the work space of the robot 13 which is shown in FIG. 1 three-dimensionally. As illustrated, the screen of the display part 12 displays a robot model 30 which expresses the robot 130 three-dimensionally, a container model 50 which expresses the container 150 three-dimensionally, and workpiece models 60 which express the workpieces 160 three-dimensionally. Further, a hand 32 of robot model 30 and a bottom 52 and peripheral wall 54 of the container model 50 are respectively displayed on the screen.

FIG. 2 displays only two-dimensional information on the display part 12, but the operator can use a mouse, keyboard, or other input device to change the viewing point to thereby check the positional relationship among the different elements in a three-dimensional space.

The robot simulation system 10 is configured to perform the takeout process by the robot model 30 successively taking out the workpiece models 60 which are bulk stacked in the container model 50 in the virtual space. The operator can determine whether the control program for the robot 130 is suitable, while checking the state of simulation being run in the virtual space.

FIG. 3 is a functional block diagram of the robot simulation system 10. As shown in the figure, the robot simulation system 10 includes a virtual space creation part 14, a model creation part 16, a model placement part 18, a drop operation simulation part 20, a bulk stacked state creation part 22, a position and posture calculation part 24, and a judgment part 26.

The virtual space creation part 14 has the function of creating a virtual space which three-dimensionally expresses the work space of the robot 130, as shown in FIG. 1. The virtual space which is created by the virtual space creation part 14 is displayed on the screen of the display part 12 of the robot simulation system 10 (see FIG. 2).

The model creation part 16 has the function of creating a robot model 30, container model 50, and workpiece models 60 which respectively three-dimensionally express the robot 130, the container 150, and the workpieces 160. The models 30, 50 and 60 are created, for example, in accordance with shape information of the respective elements which are stored in the ROM of the robot simulation system 10. Alternatively, the operator may use the input means of the robot simulation system 10 to set the shapes of the models 30, 50, and 60.

The model placement part 18 has the function of placing the robot model 30, container model 50, and workpiece models 60 which were created by the model creation part 16 at predetermined positions in the virtual space.

The drop operation simulation part 20 has the function of simulating the dropping motion of the workpieces 160 in consideration of the gravity which acts on the workpiece models 60, the interference between the workpiece models 60, and the interference between the workpiece models 60 and the container model 50. The drop operation simulation part 20, as explained later, may also be configured so as to simulate the behavior of the workpieces 160 in consideration of the impact force and frictional force which act on the workpiece models 60.

The bulk stacked state creation part 22 has the function of creating a bulk stacked state where a plurality of the workpiece models 60 are bulk stacked in the container model 50, based on the positions and postures of the workpiece models 60 which are obtained as a result of simulation of the drop operation of the workpieces 160.

The position and posture calculation part 24 has the function of calculating the positions and postures of the workpiece models 60 in the virtual space. The position of a workpiece model 60 is, for example, determined in accordance with the position of the center of gravity of the workpiece model 60 in a reference coordinate system which is defined in the virtual space. The posture of the workpiece model 60 is, for example, calculated in accordance with a tilt angle of the plane which extends through the center of gravity of the workpiece model 60.

The judgment part 26 has the function of judging if the drop operation of the workpiece models 60 has finished. The judgment part 26, for example, is configured to judge that the drop operation of the workpiece models 60 has finished when the amounts of change of the positions and postures of the workpiece models 60 which are detected by the position and posture calculation part 24 become sufficiently small. That is, a drop operation is considered to be finished when the behaviors of the workpiece models 60 after dropping down wind down.

The robot simulation system 10 is configured to be able to create workpieces bulk stacked in a container in a virtual space in accordance with an operating program which is stored in the ROM. FIG. 4 is a flow chart which shows the flow of the process for creating workpiece models in a bulk stacked state.

First, at step S401, the virtual space creation part 14 creates a three-dimensional virtual space which corresponds to the work space of the robot 130 (see FIG. 1). The created virtual space is displayed on the display part 12 of the robot simulation system 10.

Next, at step S402, the model creation part 16 creates a three-dimensional container model 50 and workpiece models 60 which respectively correspond to the container 150 and the workpieces 160.

At step S403, the model placement part 18 places the container model 50 and the workpiece models 60 which were created at step S402 in the virtual space. In the present embodiment, the workpiece models 60 are arranged above the container model 50 ignoring the action of gravity.

Figure 5A:
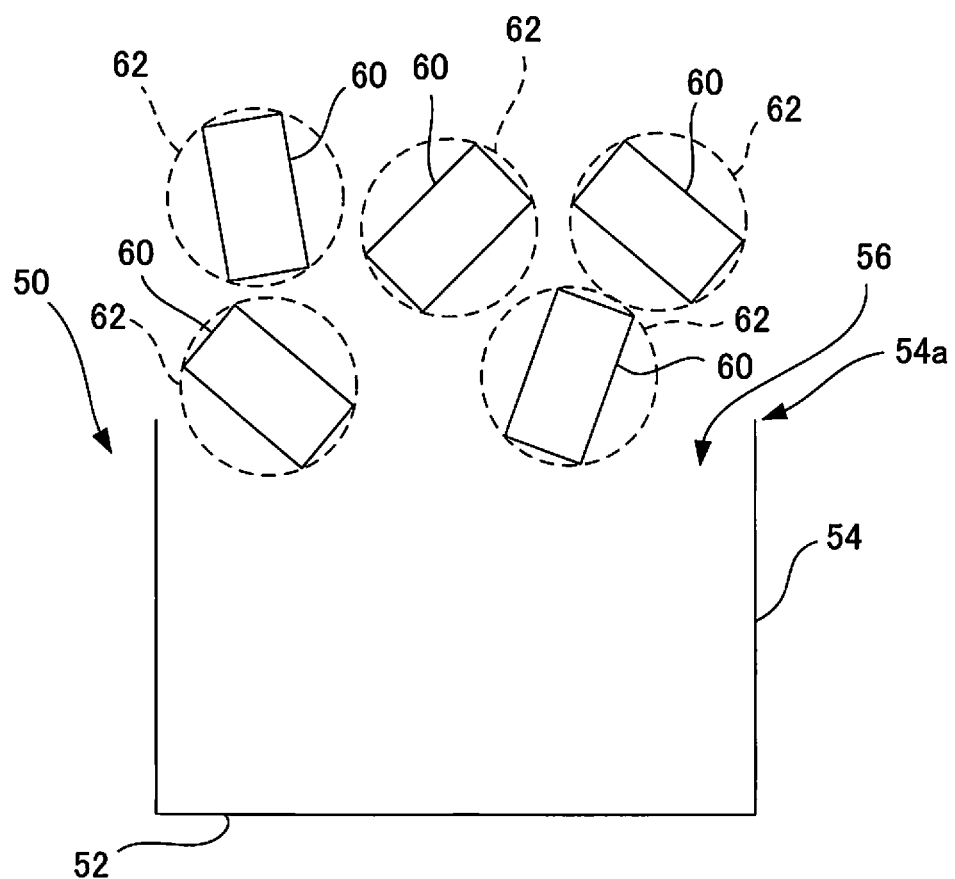
FIG. 5A is a view for explaining placement conditions of workpiece models.
Figure 5B:
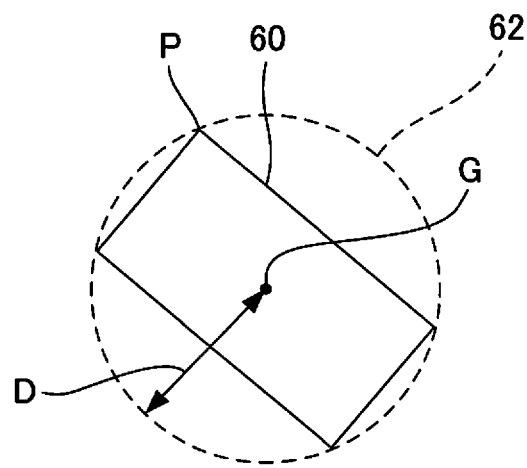
FIG. 5B is an enlarged view which shows enlarged one of the workpiece models which are shown in FIG. 5A.

FIG. 5A is a view for explaining the placement conditions of the workpiece models 60. FIG. 5B is an enlarged view which shows enlarged one among the workpiece models 60 which are shown in FIG. 5A. In FIG. 5A, virtual spheres 62 which correspond to the workpiece models 60 are drawn by broken lines. Note that, the spheres 62 are utilized when determining the initial positions of the workpiece models 60, but there is no need for them to be actually displayed on the display part 12.

As shown in FIG. 5B, the spheres 62 are spheres which have centers of gravity G of the workpiece models 60 as their centers and have distances D from the centers of gravity G to the vertexes P which are positioned the farthest from the centers of gravity G as radii. In the case of a workpiece model 60 which has a rectangular parallelepiped shape as illustrated, the distances between the vertexes and the center of gravity G are the same as each other, so any vertex may be selected.

As will be understood with reference to FIG. 5A again, the spheres 62 do not overlap each other, that is, the distances between the centers of gravity G of the spheres 62 are 2D or more. If placing the workpiece models 60 in this way, it is possible to prevent the workpiece models 60 from overlapping each other at their initial positions.

Further, the spheres 62 are placed at the inside of the region which is defined by the virtual lines which are extended from the tip end 54a of the peripheral wall 54 of the container model 50 upward in the vertical direction. By such placement, when the workpiece models 60 are made to drop down as explained later, the workpiece models 60 can be guaranteed to drop into the accommodation space 56 of the container model 50. If configuring the model placement part 18 so as to place the workpiece models 60 in accordance with such predetermined placement conditions, the load on the operator can be reduced.

Note that, the positions of the workpiece models 60 (positions of centers of gravity G) are determined in accordance with predetermined conditions as explained above, but the postures of the workpiece models 60 are, for example, randomly set in accordance with random numbers. Alternatively, the postures of the workpiece models 60 may be freely set by the operator.

Returning to FIG. 4, at step S404, the drop operation simulation part 20 simulates a drop operation where the workpiece models 60 which were placed at their initial positions at step S403 drop into the container model 50. That is, the gravity which had been ignored at step S403 is considered here so as to calculate the behavior of the workpiece models 60 when dropping down.

FIG. 6A is a view which shows the workpiece models 60a, 60b and 60c at the initial positions. FIG. 6B is a view which shows the state where the workpiece models 60a, 60b and 60c are made to drop from the initial positions of FIG. 6A. FIG. 6B, for reference, shows the workpiece models 60a, 60b and 60c in the middle of dropping from the initial positions by broken lines. FIG. 6A and FIG. 6B, for simplification of the explanation, shows only the three workpiece models 60a, 60b and 60c, but any number of workpiece models can be arranged.

In the simulation of the drop operation which is run at step S404, interference which acts between the workpiece models 60a, 60b and 60c and interference between the workpiece models 60a, 60b and 60c and container model 50 are considered. "Interference" between two elements referred to here means movement of one element being physically obstructed by the presence of the other element. FIG. 6B shows an interfering part Q1 between the workpiece model 60a and the workpiece model 60b, an interfering part Q2 between the workpiece model 60b and the workpiece model 60c, an interfering part Q3 between the workpiece model 60a and the container model 50, and an interfering part Q4 between the workpiece model 60c and the container model 50.

Figure 7:
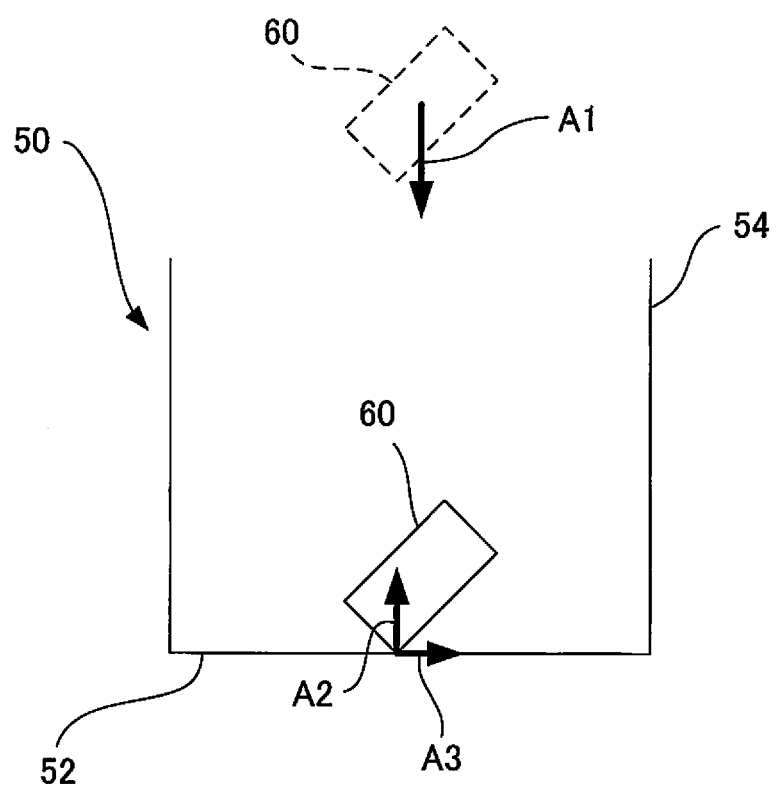
FIG. 7 is a view which shows the gravity, impact force, and frictional force which act on a workpiece model.

Further, in simulation of a drop operation, the frictional force and impact force which act on the workpiece models 60a, 60b and 60c may be further considered. FIG. 7 is a view which shows the gravity, impact force, and frictional force which act on the workpiece models 60. In FIG. 7, to simplify the explanation, only one workpiece model 60 is shown.

The arrow mark A1 in FIG. 7 shows the direction of action of gravity. The arrow mark A2 shows the direction of action of the impact force when the workpiece model 60 drops to the bottom 52 of the container model 50. The arrow mark A3 shows the direction of action of the frictional force between the workpiece model 60 and the bottom 52 of the container model 50.

The forces which act on the workpiece model 60 are respectively calculated by the following calculation formulas (1) to (3).

$$\text{Gravity} = Mg \quad \text{formula (1)}$$

$$\text{Impact force} = MV(1+e)/t \quad \text{formula (2)}$$

$$\text{Frictional force} = \mu sMg \quad \text{formula (3)}$$

Note that, "M" indicates a mass of the workpiece model 60, "g" indicates an acceleration of gravity, "V" indicates a speed right before the workpiece model 60 strikes the container model 50, "e" indicates a coefficient of restitution, "t" indicates an impact time between the workpiece model 60 and the container model 50, "μ" indicates the coefficient of dynamic friction, and "s" indicates the contact area between the workpiece model 60 and the container model 50. Note that, at this time, it is assumed that the position of the container model 50 is unchanged. The parameters required for simulation of the drop operation are stored in the ROM of the robot simulation system 10 or are set using input means.

Referring again to FIG. 4, while running the simulation of the drop operation, the position and posture calculation part 24 calculates the positions and postures of the workpiece models 60a, 60b and 60c with a predetermined cycle (step S405).

Next, at step S406, the amounts of change of the positions and postures of the workpiece models 60a, 60b and 60c are calculated and the obtained amounts of change are compared with predetermined threshold values. If, at step S406, the amounts of change of the positions and postures of the workpiece models 60a, 60b and 60c are equal to or greater than the threshold values, the judgment part 26 judges that the drop operation has not completely ended. In that case, the routine returns to step S404 to continue the simulation of the drop operation.

On the other hand, when, it is judged at step S406 that the amounts of change of the positions and postures of the workpiece models 60a, 60b and 60c were smaller than the threshold values, the judgment part 26 judges that the drop operation of the workpiece models 60a, 60b and 60c has finished. Note that, the threshold value which is compared with the amounts of change of positions at step S406 is not limited, but for example a value of one-hundredth of the radius D (see FIG. 5B) of the spheres which are linked with the workpiece models 60 may be used. Further, the threshold value which is compared with the amounts of change of posture (amount of change of tilt angle) is not limited, but for example may be 0.1 degree.

Based on the positions and postures of the workpiece models 60a, 60b and 60c when the drop operation is finished, obtained in this way, the bulk stacked state creation part 22 creates the bulk stacked state of the workpiece models 60a, 60b and 60c. The created bulk stacked state is used for simulating the process of the robot successively taking out workpieces.

According to the present embodiment, the bulk stacked state of workpiece models in the container model is created while considering the gravity which acts on the workpiece models, the interference between workpiece models, and the interference between the workpiece models and the container model. Due to this, it becomes possible to create in the virtual space a state close to the bulk stacked state which can actually arise. Further, if using such workpieces in the bulk stacked state for running a simulation of the takeout process, the reliability of the simulation can be improved.

Optionally, if running a simulation of the drop operation while considering impact force and frictional force which act on the workpiece model, it becomes possible to create a still more natural bulk stacked state in the virtual space.

FIG. 8 is a functional block diagram of a robot simulation system 10 which is configured so as to create workpiece models in the bulk stacked state while running the simulation of the takeout process. As illustrated, the robot simulation system 10 includes, in addition to the configuration which is shown in FIG. 3, a takeout process simulation part 21, position and posture change judgment part 23, and initial placement setting part 25.

The takeout process simulation part 21, as shown in FIG. 1, has the function of simulating the takeout process for successively taking out the workpieces 160 from the container 150 by a robot 130. Since such simulation of the takeout process is known, a detailed explanation will be omitted in this specification.

The position and posture change judgment part 23 has the function of judging whether at least one of the positions and postures of the workpiece models 60 has changed during simulation of the takeout process. During simulation of the takeout process, the positions and postures of the workpiece models 60 are periodically calculated by the position and posture calculation part 24. Therefore, position and posture change judgment part 23 is configured to cooperate with the position and posture calculation part 24 to perform the above judgment.

The initial placement setting part 25 has the function of setting the initial placement when the drop operation simulation part 20 simulates a drop operation of the workpieces 160.

Figure 10A:
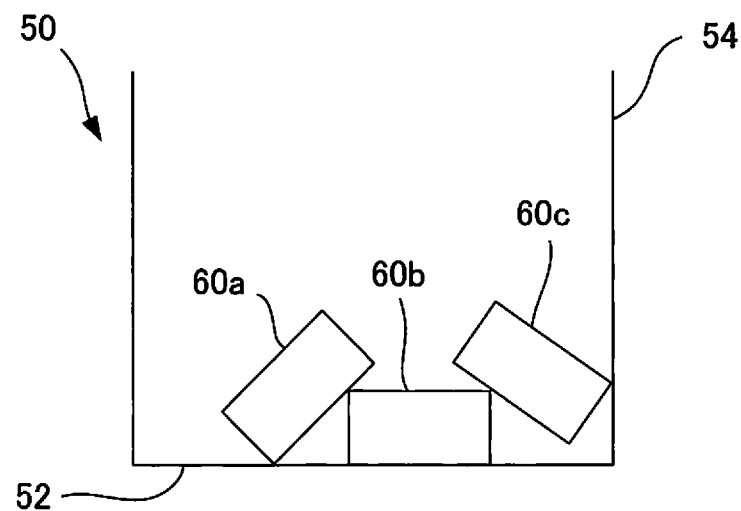
FIG. 10A is a view which shows workpiece models in the bulk stacked state.
Figure 10B:
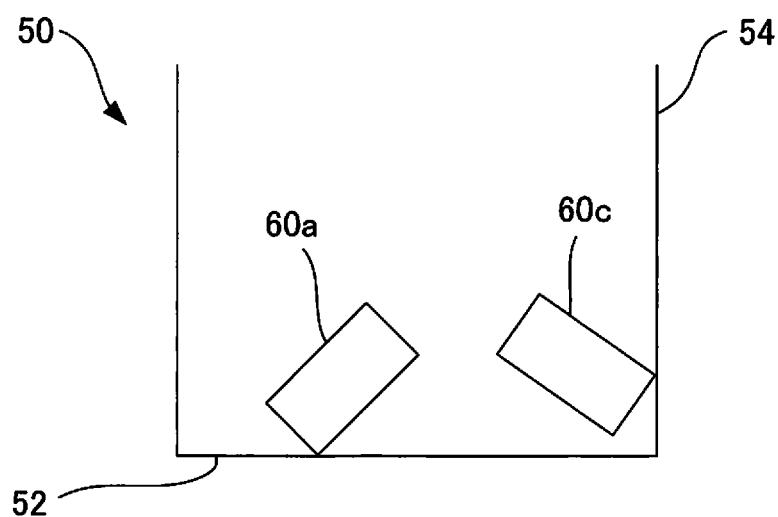
FIG. 10B is a view which shows the state in which the positions and postures of workpiece models are changed.

FIG. 10A shows the workpiece models 60a, 60b and 60c which are bulk stacked in the container model 50. FIG. 10B shows the state where the workpiece model 60b is taken out from the container model 50. The workpiece models 60a and 60c are in the air since the effect of gravity is ignored at this time. In this way, when the position and posture of the workpiece model 60b change, the positions and postures of the other workpiece models 60a and 60c sometimes become unnatural. In the related art, the simulation of the takeout process is continued with this unnatural state.

According to the robot simulation system 10 of the present embodiment, the bulk stacked state is created again by running the simulation of the drop operation of the workpiece while using the state which is shown in FIG. 10B as the initial placements of the workpiece models 60a and 60c. FIG. 10C shows the state after causing the workpiece models 60a and 60c which are shown in FIG. 10B to drop down by taking into account the action of gravity.

FIG. 9 is a flow chart which shows the flow of the processes of creating the workpiece models in the bulk stacked state during the simulation of the takeout process.

First, at step S901, the takeout process simulation part 21 runs simulation of the takeout process of taking out workpieces which are bulk stacked in the container. At this time, the workpiece models 60 in the virtual space are bulk stacked inside the container model 50 by the bulk stacked state creation part 22 in the way explained above (see FIG. 10A).

At step S902, it is judged whether the simulation of the takeout process has finished. When the simulation has finished, end processing is performed.

When it was judged at step S902 that the simulation of the takeout process has not finished, the position and posture calculation part 24 calculates the positions and postures of the workpiece models 60a, 60b and 60c (step S903). Further, at step S904, the position and posture change judgment part 23 judges whether the positions or postures of the workpiece models 60a, 60b and 60c have changed. When it is judged that the positions or postures of the workpiece models 60a, 60b and 60c have not changed, the routine returns to step S901 where the simulation of the takeout process is continued.

On the other hand, when it was judged at step S904 that the positions or postures of the workpiece models 60a, 60b and 60c has changed (see FIG. 10B), the routine proceeds to step S905. At step S905, the positions and postures of the workpiece models 60 which are calculated at the prior step S903 are set as the initial arrangement.

Next, at step S906, the drop operation of the workpiece models 60 is simulated in accordance with the initial arrangement which is set at step S905. Since the processes of steps S906 to S908 correspond to the processes of steps S404 to S406 of FIG. 4 and can be performed in a similar manner, a detailed explanation will be omitted.

In accordance with the processes of steps S906 to S908, the bulk stacked state creation part 22 creates the bulk stacked state of the workpiece models, and then the routine returns to step S901 where the newly created bulk stacked state workpieces are used for continued simulation of the takeout process by the robot.

According to such an embodiment, when at least one of the position and posture of a workpiece changes during the simulation of the takeout process, the new layout of the workpieces after the change is used as a basis for the bulk stacked state of the workpieces to be created again. Due to this, it becomes possible to maintain a natural bulk stacked state at all times during simulation of the takeout process. Therefore, the reliability of the simulation of the takeout process can be enhanced.

EFFECT OF THE INVENTION

According to the robot simulation system having the above configuration, it becomes possible to create workpiece models which are bulk stacked in a container model in consideration of the effect of gravity and create a more natural bulk stacked state. Due to this, it becomes possible to simulate the takeout process of workpieces under conditions close to an actual bulk stacked state and improve the reliability of the simulation.

Although the various embodiments and modifications of the present invention have been described above, it is apparent to a person skilled in the art that functions and effects intended by the present invention can be obtained through other embodiments and modifications. In particular, constituent elements of the embodiments and the modifications described above can be removed or replaced, or a known element can further be added thereto, without departing from the scope of the present invention. In addition, it is apparent to a person skilled in the art that the present invention can be implemented by any combination of the features of the embodiments disclosed implicitly or explicitly in the present specification.

What is claimed is:

1. A robot simulation system for simulating a takeout process of successively taking out, by a robot, a plurality of workpieces which are bulk stacked in a container in a work space, the robot simulation system comprising a processor including:
   a virtual space creation part configured to create a virtual space which expresses the work space three-dimensionally;
   a model creation part configured to
      create a container model which expresses the container three-dimensionally, and
      create a plurality of the workpiece models which express the plurality of the workpieces three-dimensionally;
   a model placement part configured to
      place the container model in the virtual space, and
      place the workpiece models which have any postures at initial positions above the container model, wherein the workpiece models do not interfere with each other and wherein the workpiece models drop into an inside of the container model;
   a drop operation simulation part configured to perform a simulation of a drop operation in which
      the workpiece models drop from the initial positions into the inside of the container model by action of gravity, and
      at least one of the workpiece models, while being dropped into the container model by action of gravity, is rotated in response to interference of said at least one workpiece model with another workpiece model or with the container model; and
   a bulk stacked state creation part configured to create a bulk stacked state of the workpiece models, based on positions and postures of the workpiece models which are obtained as a result of the simulation of the drop operation.

2. The robot simulation system according to claim 1, wherein the drop operation simulation part is configured to perform the simulation of the drop operation by taking into account the gravity which acts on the workpiece models, interference between the workpiece models, and interference between the workpiece models and the container model.

3. The robot simulation system according to claim 2, wherein the drop operation simulation part is configured to perform the simulation of the drop operation by additionally taking into account an impact force and a frictional force which act on the workpiece models.

4. The robot simulation system according to claim 1, said processor further comprising:
   a position and posture calculation part configured to calculate the positions and postures of the workpiece models during the simulation of the drop operation; and
   a judgment part configured to judge whether the simulation of the drop operation has finished, wherein
   the judgment part is configured to judge that the simulation of the drop operation has finished when amounts of change of the positions and postures of the workpiece models which are calculated by the position and posture calculation part are smaller than predetermined threshold values.

5. The robot simulation system according to claim 4, wherein
   the position and posture calculation part is configured to calculate positions and postures of the workpiece models during a simulation of the takeout process,
   the drop operation simulation part is configured to perform the simulation of the drop operation of the workpiece models, based on the positions and postures of the workpiece models which are obtained by the position and posture calculation part during the simulation of the takeout process, and the bulk stacked state creation part is configured to create the bulk stacked state of the workpiece models, based on the positions and postures of the workpiece models which are obtained as a result of the simulation of the drop operation during the simulation of the takeout process.

\* \* \* \* \*